United States Patent
Al-Shaikh et al.

(10) Patent No.: US 6,221,221 B1
(45) Date of Patent: Apr. 24, 2001

(54) APPARATUS FOR PROVIDING RF RETURN CURRENT PATH CONTROL IN A SEMICONDUCTOR WAFER PROCESSING SYSTEM

(75) Inventors: Ayad Al-Shaikh, Palo Alto; Michael Rosenstein, Sunnyvale; Bradley O. Stimson; Jianming Fu, both of San Jose; Praburam Gopalraja, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/192,872

(22) Filed: Nov. 16, 1998

(51) Int. Cl.⁷ .................................................. C23C 14/34
(52) U.S. Cl. ........................ 204/298.02; 204/298.11; 204/298.15; 204/298.31; 118/723 E; 118/729
(58) Field of Search .................... 209/298.11, 298.15, 209/298.02, 298.31; 118/228, 729, 723 E; 156/345

(56) References Cited

U.S. PATENT DOCUMENTS 3,661,758 * 5/1972 Jackson et al. ........................ 204/298
4,131,533 * 12/1978 Bialko et al. ......................... 204/298
4,170,541 * 10/1979 Lamont, Jr. .......................... 204/298
5,234,529 * 8/1993 Johnson .............................. 156/345
5,275,683   1/1994 Arami et al. ......................... 156/345
5,790,365   8/1998 Shel .................................... 361/234

FOREIGN PATENT DOCUMENTS 0 732 728 A2   9/1996 (EP) .............................. H01L/37/32
2 683 395      5/1993 (FR) .............................. H01R/3/00
97/42648      11/1997 (WO) ............................. H01J/37/32

* cited by examiner

*Primary Examiner*—Stephen Kalafut
*Assistant Examiner*—Julian A. Mercado
(74) *Attorney, Agent, or Firm*—Thomason, Moser & Patterson, LLP

(57) ABSTRACT

Apparatus providing a low impedance RF return current path between a shield member and a pedestal in a semiconductor wafer processing chamber. The return path reduces RF voltage drop between the shield member and the pedestal during processing. The return path comprises a conductive strap connected to the pedestal and a conductive bar attached to the strap. A toroidal spring makes multiple parallel electrical connections between the conductive bar and the shield member. A support assembly, attached to a collar on the chamber wall, supports the conductive bar.

20 Claims, 4 Drawing Sheets

APPARATUS FOR PROVIDING RF RETURN CURRENT PATH CONTROL IN A SEMICONDUCTOR WAFER PROCESSING SYSTEM

BACKGROUND OF THE DISCLOSURE

1. Field of the Invention

The invention relates to semiconductor wafer processing equipment and, more particularly, the invention relates to a return path for RF current within such equipment.

2. Description of the Background Art

Plasma-enhanced reactions and processes have become increasingly important to the semiconductor industry, providing for precisely controlled thin-film depositions.

FIG. 1 depicts a cross-sectional, simplified view of a conventional physical vapor deposition (PVD) wafer processing chamber 100 of the prior art. The chamber 100 comprises a set of walls that define a volume having a conventional pedestal assembly 102 positioned in the volume. The pedestal assembly 102 comprises a pedestal 106 and a susceptor 107. The susceptor 107 has a surface 114 that supports a wafer 104. A chamber lid 110 at the top of the chamber 100 contains deposition target material (e.g., titanium) and is negatively biased by a DC source 119 to form a cathode. Alternately, a separate target is suspended from the chamber lid 110. The chamber lid 110 is electrically insulated from the remainder of the chamber 100. Specifically, an insulator ring 112, electrically isolates the chamber lid 110 from a grounded annular shield member 134 which forms an anode. The pedestal assembly 102 has a range of vertical motion within the chamber 100 to facilitate wafer transfer. The pedestal assembly is depicted in a raised position (wafer processing position) in FIG. 1. The chamber includes a ring assembly 118 that prevents deposition from occurring in unwanted locations such as upon the sides of the susceptor, beneath the pedestal and the like. Specifically, a waste ring 120 and cover ring 122 prevent sputtered material from being deposited on surfaces other than the substrate.

An electric field is induced in a reaction zone 108 between the cathode chamber lid 110 and anode shield member 134 when the DC source 119 is switched on. A process gas such as argon is provided to the reaction zone 108 via a working process gas supply (not shown). The electric field created by the high power DC source 119 ionizes the process gas and creates a uniform, high-density, low electron temperature plasma 116. The grounded shield member 134 surrounds a reaction zone 108 and confines the plasma 116 to enhance deposition.

To further enhance deposition in an ion metallization system, a specific type of PVD system, the substrate 104 and susceptor 107 are biased negatively with respect to the plasma 116. This is accomplished by providing RF power to an electrode 130 within the pedestal assembly 102. Ordinarily, a 400 KHz AC source 136 is used to bias the substrate 104, but other frequency sources such as a 13.56 MHz source may also be used. A negative DC potential (i.e., a bias voltage) accumulates on the substrate 104 as a result of the higher velocity of electrons as compared to the positive ions in the plasma 116. In some PVD processes, as neutral target material is sputtered from the target and enters the plasma 116, the target material becomes positively ionized. With the negative DC offset at the substrate, the positively ionized target material is attracted to and deposits on the substrate in a highly perpendicular manner. That is, the horizontal component of acceleration and/or velocity of the positive ion is reduced while the vertical component is enhanced. As such, the deposition characteristic known as "step coverage" is improved.

Ideally, the bias voltage on the substrate 104 (i.e., a semiconductor wafer) remains stable as the target material is being deposited onto the substrate 104. A stable voltage level at the substrate 104 causes the ionized deposition material to be drawn uniformly to the substrate 104. A uniform deposition film layer is a highly desirable characteristic in the semiconductor wafer manufacturing industry. Voltage stability is optimized when there is no appreciable voltage drop due to current flowing in the return path from the shield member 134 to ground.

In the prior art, the ground path for RF current is rather circuitous. For example, the substrate 104 is in electrical contact with the plasma 116 which is in electrical contact with the shield member 134. The shield member 134 is connected to the chamber wall 103. The chamber wall 103, in turn, is connected to the pedestal 106 through a flexible bellows 138. The pedestal is connected to ground through a tube 140 that runs inside the bellows 138. Typically, the bellows 138 are made of thin stainless steel discs welded together. The discs are very thin and stainless steel has a relatively low conductivity. This is not a problem for DC currents since the voltage drop over the return path is small. However, for RF applications, currents of approximately 20 to 30 amps are common. The stainless steel bellows 138 have a high RF impedance. As such, the bellows are unsuitable as a return path for RF currents since a large voltage drop develops across the bellows during processing. Such a large voltage drop, induced by the large impedance of the return current path, causes high voltages on the surface of the pedestal 106. Plasma can strike between two points at substantially different voltages and lead to stray plasma in the chamber. For example, such an unwanted plasma can strike between the pedestal 106 at a high potential and some other nearby grounded feature such as the shield member 134, the chamber walls 103 or bake out lamps (not shown). The stray plasma spreads out to fill all of the space outside the reaction zone 108 (i.e., the region between the pedestal 106, the bellows 138, the shield member 134 and the chamber walls 103). The stray plasma may sputter material from the bellows 138 and pedestal 106 introducing contaminants into the chamber environment as well as reducing the life of the pedestal assembly.

In a 300 mm wafer processing system the path to ground is especially long and the voltages induced are quite high (e.g., approximately 700 volts peak to peak). As such, the voltage on the wafer 104 becomes unstable and non-reproducible. The long return path also creates a variable impedance that changes after each repositioning. A ground path could be made between the shield member 134 and the pedestal 106 via the waste ring 120 and the cover ring 122. However, this path would be broken each time the pedestal assembly 102 is lowered and raised during wafer transfer and, therefore, would be unreliable.

Therefore, a need exists in the art for reliable low impedance return path for RF current to ensure wafer voltage stability and uniformity of deposition.

SUMMARY OF THE INVENTION

The disadvantages associated with the prior art are overcome by the present invention of an apparatus for providing an RF return path having a low impedance electrical connection between a shield member and a grounded pedestal of a semiconductor wafer processing chamber. The inventive apparatus comprises a low impedance return path assembly that forms a direct electrical connection between the shield member and the pedestal. The return path assembly comprises a conductive strap connected to the pedestal and a conducting bar connected to the strap. The bar makes electrical contact with the shield member via a toroidal spring. A support assembly mechanically supports a part of the return path assembly. Specifically, the support assembly, comprising vertical and horizontal bars, supports the conductive bar. The support assembly is attached to a collar that is secured to a bottom chamber wall.

The return path thus provides a short-cut for RF current flowing from the shield member to ground. The short-cut avoids the circuitous path that existed in the prior art and thereby reduces the RF voltage drop between the shield member and ground. The ground path remains intact throughout wafer cycling and is only disconnected when the shield member is removed.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
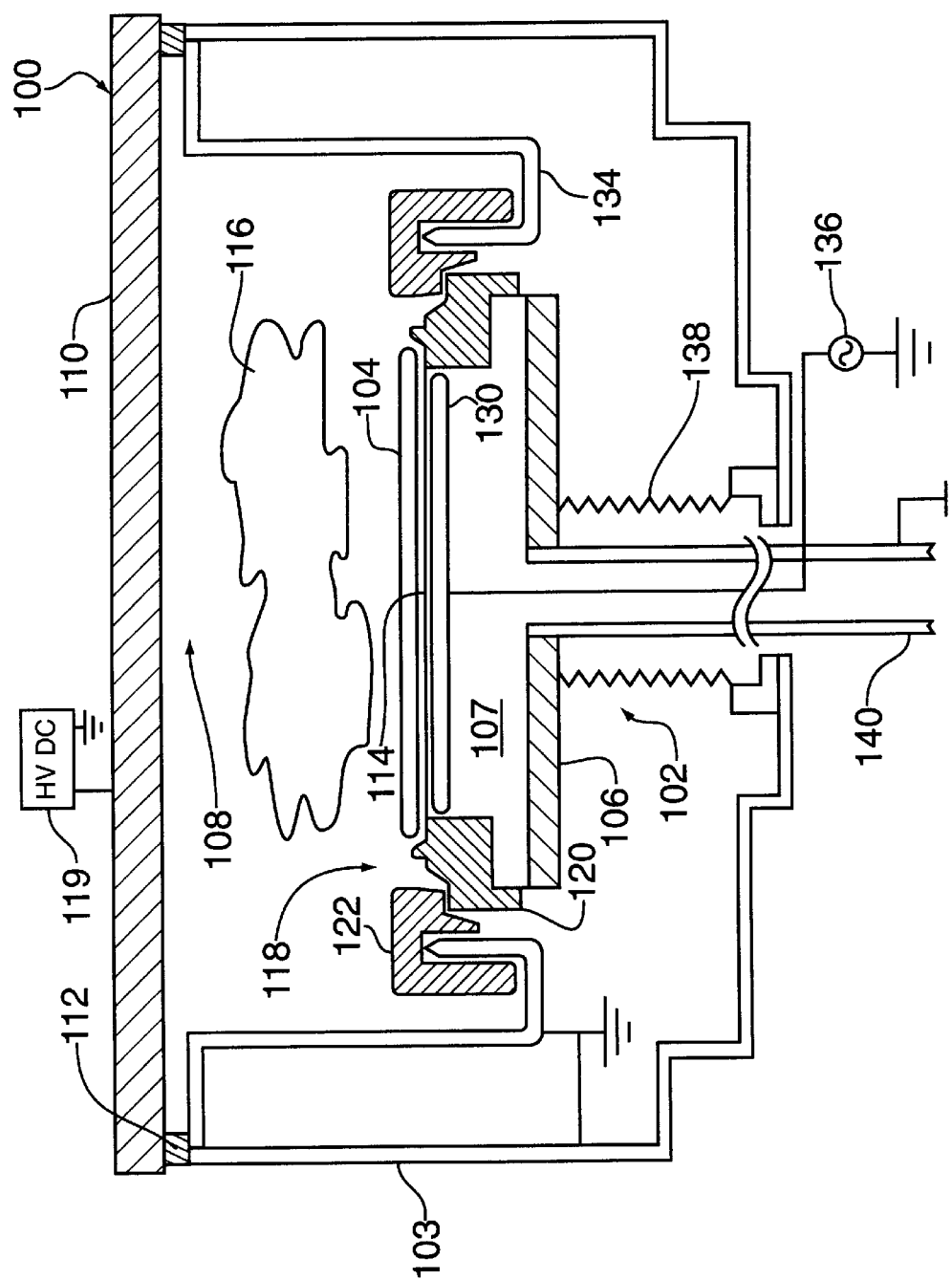
FIG. 1 is a cross-sectional view of a prior art substrate support in a wafer processing chamber.
Figure 2:
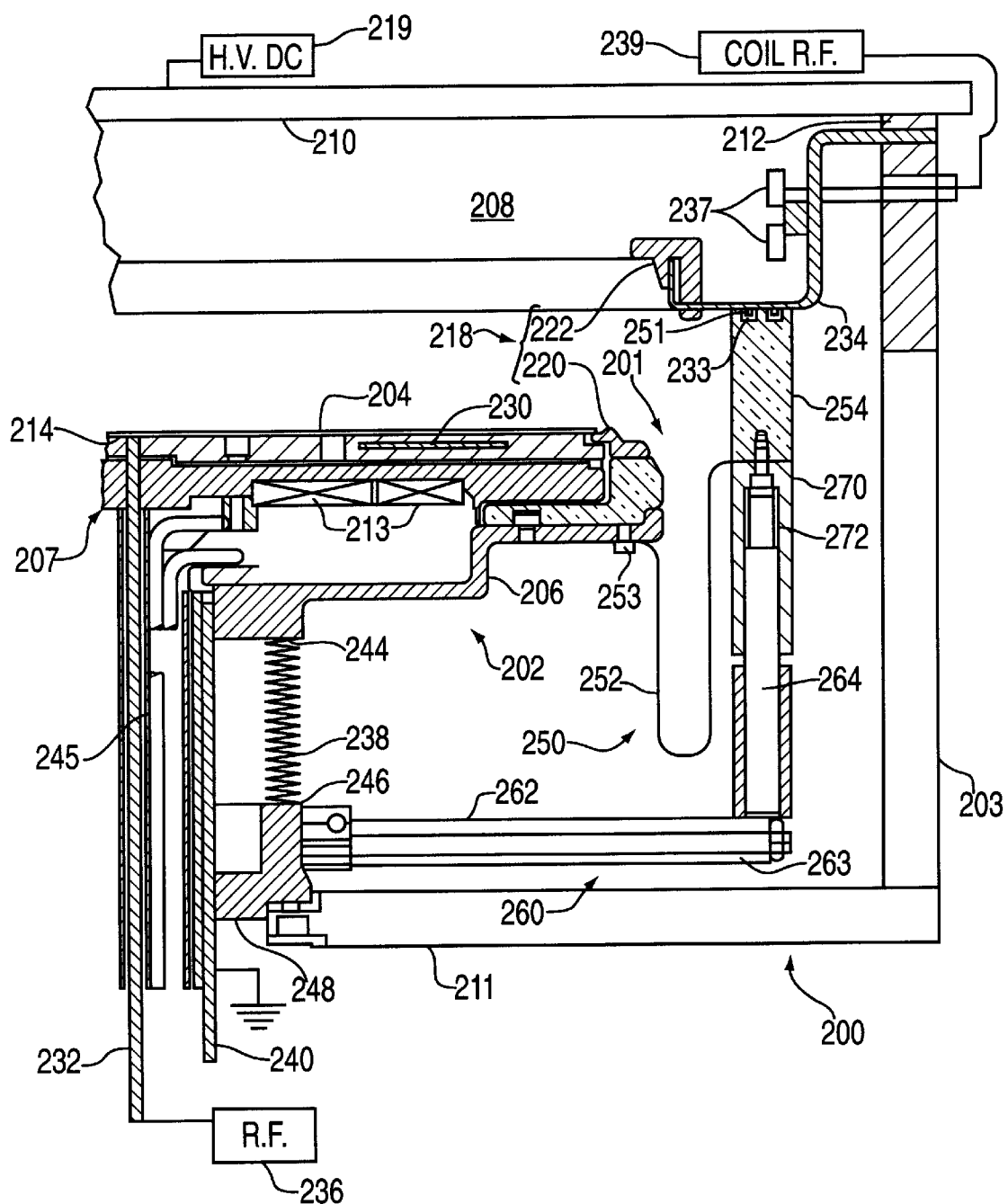
FIG. 2 is a detailed cross-sectional view of a portion of a semiconductor wafer processing chamber employing the RF return path apparatus of the present invention.

FIG. 2 depicts a cross-sectional view of a portion of a semiconductor wafer processing chamber 200 that utilizes the RF return current path apparatus 201 of the present invention. The chamber 200 comprises a set of vertical walls 203 and a bottom wall 211 that define a volume. The chamber 200 is, for example, a PVD wafer processing chamber that contains a conventional pedestal assembly 202, a ring assembly 218 and an annular shield member 234. An example of the chamber 200 is a 300 mm PVD chamber manufactured by Applied Materials, Inc. of Santa Clara, Calif. The RF return current path apparatus 201 of the present invention comprises a return path assembly 250 and a support assembly 260. A chamber lid 210 at the top of the chamber 200 contains deposition target material (e.g., titanium) and is negatively biased by a DC source 219 to form a cathode. The annular shield member 234 forms an anode. The annular shield member 234 is suspended from the vertical chamber walls and defines the lateral boundary of a reaction zone 208. An insulator ring 212 electrically insulates the chamber lid 210 from the shield member 234.

The pedestal assembly 202 supports and retains a wafer 204 in the chamber 200. The pedestal assembly 202 comprises a pedestal 206 (sometimes called a "dog dish"), a susceptor 207 a waste ring 220, a bellows 238, a tube 240 and a collar 248. The susceptor 207 is typically made of a dielectric material such as a polymer or ceramic. The susceptor 207 has a surface 214 that supports the wafer 204.

The pedestal includes one or more resistive heaters 213. An electrode 230 within the susceptor 207, acts as an additional cathode for conducting electrical power during wafer processing. Furthermore, the susceptor 207 may optionally include electrodes (not shown) for electrostatically attracting (chucking) the wafer 204 to the susceptor surface 214. The ring assembly 218 comprising a waste ring 220 and a cover ring 222 prevent sputtered atoms from inadvertently depositing on or below the pedestal. The waste ring 220 abuts the pedestal 206 and captures stray target material that would otherwise deposit on the pedestal 206. The pedestal assembly 202 has a range of vertical motion within the chamber 200. The pedestal assembly 202 is depicted in a lowered position in FIG. 2. During processing, the pedestal assembly 202 is positioned in a raised position (process position). In this position, cover ring 222 slightly overlaps the waste ring 220 and the shield member 234 and thereby prevents unwanted deposition below the pedestal.

The flexible bellows 238 provide a flexible seal between the atmosphere below the pedestal 206 and the vacuum above it. The bellows 238 are attached, at an upper end 244 to the pedestal 206. A lower end 246 of the bellows 238 is attached to a collar 248. The support assembly 260 is attached to the collar 248. The collar 248 is, in turn attached to a bottom chamber wall 211. The grounded tube 240 extends from the pedestal 206 through the bellows 232 and chamber wall 211. The tube 240 mechanically supports the pedestal assembly 202 and provides a conduit for (i.e., surrounds a space for) liquid and gas lines and electrical power leads (e.g. or the heaters 213). For example, cooling tubes 245 extend inside the tube 240 to provide a coolant to the pedestal 106. Additionally, the electrode 230 is electrically connected to an RF power source 236 via a transmission line 232 that extends inside the tube 240.

The return path assembly 250 of the present invention provides a low impedance connection directly between the shield member 234 and the pedestal 206. The return path assembly comprises a conductive grounding strap 252, and a conducting bar 254. The strap 252 is attached to the pedestal 206 by conventional means such as one or more screws 253. The strap 252 is made of a highly conductive and durable material such as beryllium-copper. The strap 252 is approximately rectangular in shape and sufficiently long and flexible to allow vertical movement of the pedestal assembly 202. The length of the strap 252 is determined by the design goal that the strap not scrape against any other part of the chamber, such as the pedestal 206 or the support assembly 260, and cause the release of particles, yet not bind or become stretched as the pedestal is lowered and raised. Generally the width of the strap 252 matches a diameter of the conducting bar 254. For example, the strap is approximately 5 inches long, approximately 0.5 inches wide and approximately 0.003 to 0.004 inches thick. The strap 252 is electrically connected to the shield member 234 via the conducting bar 254. The conducting bar is typically made from oxygen free copper. A bolt 255 having a shaft 256 and a head 257 secures the strap 252 to the conducting bar 254.

Figure 3:
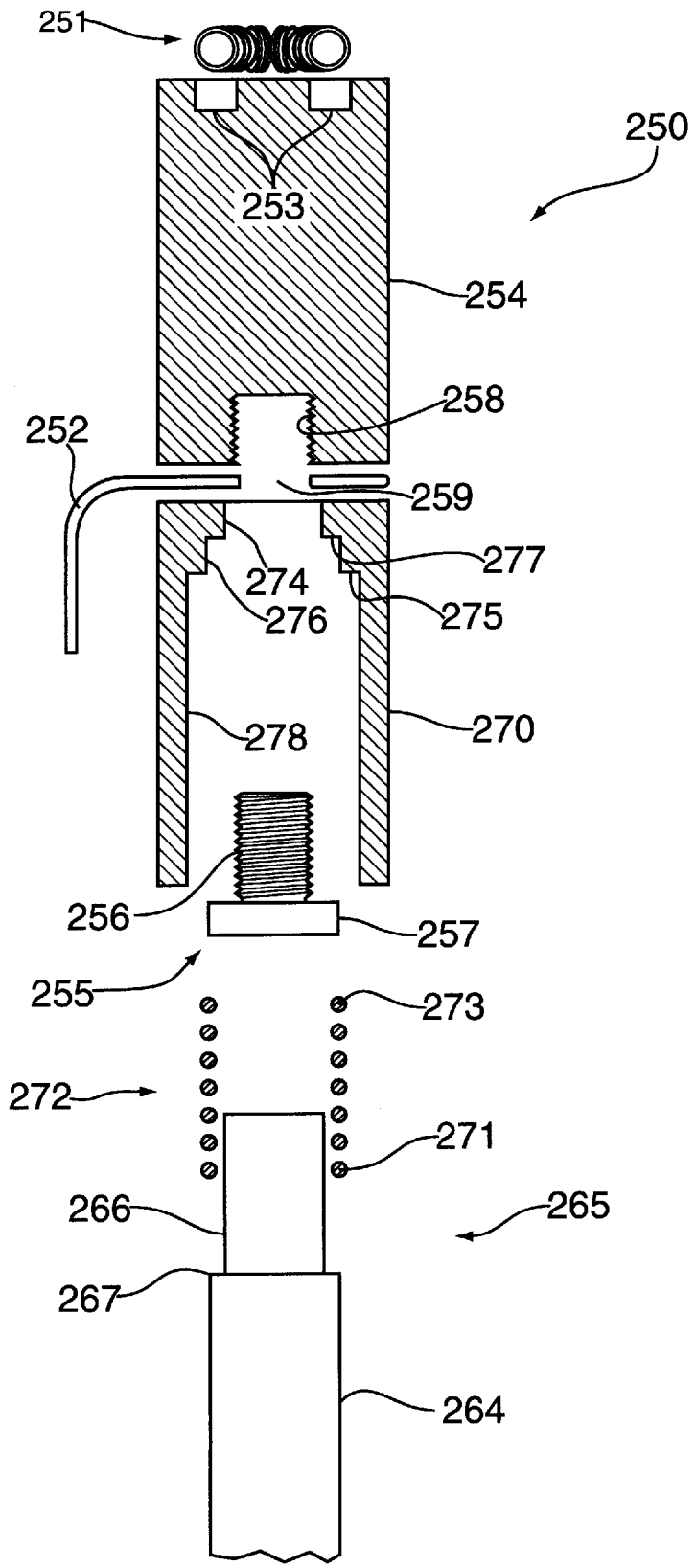
FIG. 3 is an exploded view of a part of the return path assembly of the present invention.
Figure 4:
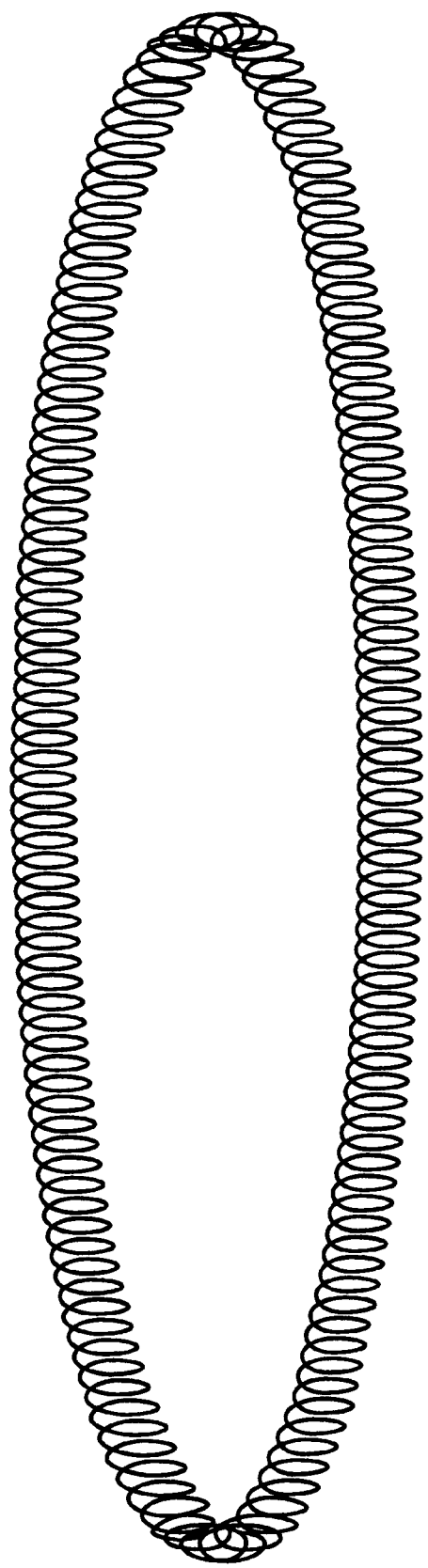
FIG. 4. is a perspective view of a toroidal spring used in the return path assembly of the present invention.

The details of the return path assembly 250 are shown in the exploded view depicted in FIG. 3. The strap 252 has a hole 259 that receives the shaft 256 of the bolt 255. The bolt 255 threads into a threaded bore 258 in the conducting bar 254. A toroidal spring 251 disposed in an annular groove 253 in the conducting bar 254 enhances electrical contact between the conducting bar 254 and the shield member 234. The toroidal spring 251 is shown in perspective in FIG. 4. The toroidal spring 251 can be made from any resilient conductive material such as stainless steel, Inconel®, or other suitable materials. Inconel® is a registered trademark of Inco Alloys International, Inc., of Huntington, W. Va. The toroidal spring 251 can optionally be plated with gold to provide resistance against corrosion, such as oxidation, and to ensure good electrical contact. The toroidal spring 251 makes multiple parallel electrical connections between the conducting bar 254 and the shield member 234. This design of the return path assembly 250 allows for easy assembly and disassembly.

The conducting bar 254 is structurally supported by a support assembly 260. An insulator 270 electrically isolates the return path assembly from the support assembly 260. The support assembly 260 comprises a horizontal bar 262 attached to the collar 248. A vertical bar 264 is attached to a distal end 263 of the horizontal bar 262. An upper end 265 of the vertical bar 264 has projecting portion 266 and an annular shelf 267. A coiled spring 272 fits over the projecting portion 266. The coiled spring 272 has a first end 271 that abuts the annular shelf 267. The spring 272 has an inside diameter that closely matches an outside diameter of the projecting portion 266.

The insulator 270 is substantially cylindrical in shape with a central bore 274 sized to receive the shaft 256 of the bolt 255. The insulator has two counterbores 276 and 278. Counterbore 276 is sized to receive the head 257 of the bolt 255. Counterbore 278 is sized to receive the vertical bar 264 and the coiled spring 272. A first lip 275 is formed at the intersection of the counterbores 276 and 278. A second end 273 of the spring 272 engages the first lip 275. A second lip 277 is formed at the intersection of the central bore 274 and the counterbore 276. The shaft 256 of the bolt 255 is received in the bore 274 and the hole 259 in the strap 252. When the bolt 255 is secured in the threaded bore 258 the insulator 272 secures the strap 252 to the conducting bar 254. The head 257 of the bolt 255 engages the second lip 277 and thereby secures the insulator 270 to the conducting bar 254. The spring 272 is entrapped between the annular shelf 267 on the vertical bar 264 and the first lip 275 in the insulator 270. The spring 272 provides a mechanical bias that urges the conducting bar 254 against the shield member 234. Counterbore 278 should have a length which is large compared to a diameter of the vertical bar 264 to ensure good alignment of the return path assembly 250.

Returning to FIG. 2, when the DC source 219 is turned on, an electric field is induced in a reaction zone 208 between the chamber lid 210 and the shield member 234 that ionizes a process gas to create a uniform, high-density, low electron temperature plasma. A coil 237, known as an ion metal plasma (IMP) coil surrounds the reaction zone 208. A coil RF power supply 239, coupled to the coil 237, provides additional RF power to the reaction zone 208. The RF power source 236 provides electrical power necessary to bias the wafer to improve film deposition. That is, a negative DC bias forms on the wafer as discussed previously. The RF power voltage applied to the wafer creates RF electric fields that causes RF current to flow from the substrate 204 to the plasma to the shield member 234 and ground. The current follows a path of least resistance from the shield member 234 to the conducting bar 254 via the toroidal spring 251 and then to the pedestal 206 via strap 252. The current flows from the pedestal 106 to ground via the tube 240.

The return current path control apparatus 201 of the present invention has a lower impedance than in the prior art due to the shorter length of the path and the higher conductivity of the strap 252 and the conducting bar 254.

Consequently, the pedestal 206 is at a lower voltage during processing. Furthermore, the ground path assembly remains intact as wafers are cycled. The connection is only broken when the shield member 234 is removed.

Therefore, the impedance of the return current path control apparatus 201 remains steady as multiple substrates are cycled through the chamber 200. As a result, deposition is uniform from substrate to substrate. Thus, productivity is increased while the number of defective substrates and cost per substrate is decreased.

Although various embodiments which incorporate the teachings of the present invention have been shown and described in detail herein, those skilled in the art can readily devise many other varied embodiments that still incorporate these teachings.

What is claimed is:

1. An apparatus for providing a return current path for RF current between a shield member and a pedestal assembly, comprising:
    a low impedance flexible strap having a first end and a second end, said first end electrically connected to said shield member and said second end connected to said pedestal assembly, said second end is adapted to move relative to the first end when said pedestal assembly moves relative to said shield member.

2. The apparatus of claim 1 wherein the pedestal assembly includes a conducting bar connected to said strap, wherein said bar makes electrical contact with the shield member.

3. The apparatus of claim 2 further comprising a toroidal spring disposed between said conducting bar and the shield member.

4. The apparatus of claim 2 further comprising a support assembly that supports said conducting bar, where said support assembly further comprises a vertical bar attached to a horizontal bar, wherein said horizontal bar is attached to the pedestal assembly.

5. The apparatus of claim 4, further comprising an insulator disposed between said conducting bar and said vertical bar.

6. The apparatus of claim 5 further comprising a spring disposed between said vertical bar and said insulator.

7. An apparatus located between a shield member and a pedestal, said shield member and pedestal being disposed in a semiconductor wafer processing chamber, said apparatus comprising:
    a low impedance flexible strap having a first end and a second end, said second end connected to said pedestal;
    a conducting bar, connected between said first end of said strap and said shield member; and
    a support assembly disposed below said conducting bar, that mechanically supports said conducting bar, wherein said second end is adapted to move relative to the first end when said pedestal assembly moves relative to said shield member.

8. The apparatus of claim 7 wherein said strap is adapted to allow vertical motion of said pedestal relative to said shield member.

9. The apparatus of claim 7 further comprising a toroidal spring disposed between said conducting bar and said shield member.

10. The apparatus of claim 9 wherein said toroidal spring makes multiple parallel electrical connections between said conducting bar and said shield member.

11. The apparatus of claim 7 wherein said support assembly comprises a vertical bar attached to a horizontal bar, said horizontal bar being attached to said pedestal.

12. The apparatus of claim 11, further comprising an insulator disposed between said conducting bar and said vertical bar.

13. The apparatus of claim 12 further comprising a spring disposed between said vertical bar and said insulator.

14. A semiconductor wafer processing chamber, comprising:
- a chamber having a set of side walls, a bottom wall and a lid;
- an annular shield member, suspended from said side walls;
- a pedestal assembly having a pedestal and a wafer support; and
- a low impedance flexible strap having a first end and a second end, said first end electrically connected to said shield member and said second end connected to said pedestal, said second end is adapted to move relative to the first end when said pedestal moves relative to said shield member.

15. The semiconductor wafer processing chamber of claim 14 wherein said flexible strap further comprises a conducting bar connected to said strap, wherein said conducting bar makes electrical contact with said shield member.

16. The semiconductor wafer processing chamber of claim 15 further comprising a toroidal spring disposed between said conducting bar and said shield member.

17. The semiconductor wafer processing chamber of claim 16 wherein said toroidal spring makes multiple parallel electrical connections between said conducting bar and said shield member.

18. The semiconductor wafer processing chamber of claim 15 further comprising a support assembly that mechanically supports a part of said conducting bar.

19. The semiconductor wafer processing chamber of claim 18 further comprising a collar attached to said bottom wall, wherein said support assembly comprises a horizontal bar attached to said collar and a vertical bar attached to said horizontal bar.

20. The semiconductor wafer processing chamber of claim 14 wherein said chamber is a PVD chamber.

* * * * *